United States Patent
Sugimoto (10) Patent No.: US 9,222,166 B2
(45) Date of Patent: Dec. 29, 2015

(54) SLIDE PARTS AND EQUIPMENT INCLUDING SAME

(75) Inventor: Itto Sugimoto, Mito (JP)

(73) Assignee: Hitachi, Ltd., Tokyo (JP)

( * ) Notice: Subject to any disclaimer, the term of this patent is extended or adjusted under 35 U.S.C. 154(b) by 964 days.

(21) Appl. No.: 13/286,700

(22) Filed: Nov. 1, 2011

(65) Prior Publication Data

US 2012/0103182 A1    May 3, 2012

(30) Foreign Application Priority Data

Nov. 2, 2010 (JP) .................... 2010-246143

(51) Int. Cl.
C23C 16/00 (2006.01)
C23C 14/06 (2006.01)
C23C 14/02 (2006.01)
(Continued)

(52) U.S. Cl.
CPC ............ *C23C 14/0605* (2013.01); *C23C 14/025* (2013.01); *C23C 14/06* (2013.01); *C23C 14/35* (2013.01); *C23C 28/322* (2013.01); *C23C 28/34* (2013.01); *C23C 28/36* (2013.01); *F04B 53/14* (2013.01); *F16J 15/324* (2013.01); *F16J 15/56* (2013.01); *F05C 2203/0808* (2013.01); *F05C 2225/04* (2013.01); *F05C 2251/10* (2013.01); *F05C 2253/12* (2013.01); *Y10T 428/31678* (2015.04)

(58) Field of Classification Search
CPC ............................ C23C 14/0605; F16J 15/324
USPC ........... 427/569, 577, 585, 590, 249.1, 249.5; 92/165 R, 223
See application file for complete search history.

(56) References Cited

U.S. PATENT DOCUMENTS 5,330,611 A * 7/1994 Doll .............................. 117/105
6,136,386 A   10/2000 Nakahigashi et al.
(Continued)

FOREIGN PATENT DOCUMENTS

JP    2000-297373 A    10/2000
JP    2003-185029 A     7/2003
(Continued)

OTHER PUBLICATIONS

Sang Hoon Kim, Optical, Mechanical and Etch Properties of Amorphous Carbon Nitride Films Grown by Plasma Enhanced Chemical Vapor Deposition at Room Temperature, Oct. 16, 2010, Synthetic Metals 160 (2010) 2442-2446.*

(Continued)

*Primary Examiner* — Edward Look
*Assistant Examiner* — Daniel Collins
(74) *Attorney, Agent, or Firm* — Crowell & Moring LLP (57) ABSTRACT

It is an objective of the invention to provide a slide part in which a seal member formed of an elastic body is in sliding contact with a hard member. There is provided a slide part comprising: a hard member having an amorphous carbon coating containing nitrogen formed on an outermost surface of a substrate; and a seal member formed of an elastic body, the seal member being in sliding contact with the hard member, wherein: content of the nitrogen in the coating is 3 at. % or more and 25 at. % or less, taking a total content of the carbon and the nitrogen in the coating as 100 at. %; the seal member contains fluorine at least in a sliding contact surface region thereof; and content of the fluorine in the surface region of the seal member is equal to or more than the nitrogen content in the coating.

10 Claims, 2 Drawing Sheets

(51) Int. Cl.
   *C23C 14/35* (2006.01)
   *C23C 28/00* (2006.01)
   *F04B 53/14* (2006.01)
   *F16J 15/32* (2006.01)
   *F16J 15/56* (2006.01)

(56) References Cited

U.S. PATENT DOCUMENTS

| | | | |
|---|---|---|---|
| 6,528,115 B1* | 3/2003 | Hirano et al. | 427/249.1 |
| 6,844,068 B1 | 1/2005 | Miyake et al. | |
| 2004/0179762 A1 | 9/2004 | Doll et al. | |
| 2010/0089134 A1* | 4/2010 | Haertl | 73/61.55 |
| 2011/0052934 A1 | 3/2011 | Sugimoto et al. | |

FOREIGN PATENT DOCUMENTS

| | | |
|---|---|---|
| JP | 2003-336542 A | 11/2003 |
| JP | 2004-137507 A | 5/2004 |
| JP | 2005-48801 A | 2/2005 |
| JP | 2005-282668 A | 10/2005 |
| JP | 2006-189025 A | 7/2006 |
| JP | 2009-169210 A | 7/2009 |

OTHER PUBLICATIONS

F.L. Freire, Boron Carbide and Boron—Carbon Nitride Films Deposited by DC- Magnetron Sputtering; Structural Characterization and Nanotribological Properties, Phys. stat. sol. 187, No. 1 ,1-12 (2001).*

DuPont Viton Selection Guide, Jul. 2, 2010, Rev. 7 found at http://www2.dupont.com/Plastics/en_US/pfo/assets/downloads/viton/Viton%20Selection%20Guide.pdf.*

Yun Sik Jin, Structural and Bonding Properties of Carbon Nitride Films prepared by DC Magnetron Sputtering, Thin Solid Films 345 (1999) 18-22.*

Martinez, Influence of the composition of BCN films Deposited by Reactive Magnetron Sputtering on their properties, Anal Bioanal Chem (2002) 374, 709-711.*

Stevens, Stability of Carbon Nitride Materials at High Pressure and Temperature, J. AM. Chem. Soc. 1996, 118.*

Erdermire & Donnet, Tribology of Diamond , Diamond-Like Carbon, and Related Films, 2001.*

Koji Kato et al., "Friction, Wear and $N_2$-Lubrication of Carbon Nitride Coatings: A Review", Available online at www.sciencedirect.com, Wear (2003), vol. 254, pp. 1062-1069.

Yuki Miyahiro et al., "Effect of Transfer Layer and Lightening of Friction of $CN_x$", Japanese Society of Tribologists, Proceedings of Jast Tribology Conference, Septemeber 2010, (seven (7) pages).

European Search Report dated Apr. 15, 2015 (Six (6) pages).

Leezenberg, et al., "Chemical modification of sputtered amorphous-carbon surfaces", Journal of Applied Physics, American Institute of Physics, vol. 89, No. 6, Mar. 15, 2001, pp. 3498-3507, XP012053156, (Ten (10) pages).

Bengu, et al., "Theoretical and spectroscopic investigations on the structure and bonding in B—C—N thing films", Thin Solid Films, Elsevier-Sequoia S.A.Lausanne, CH, vol. 518, No. 5, Dec. 31, 2009, pp. 1459-1464, XP026763992, (Six (6) pages).

* cited by examiner

FIG. 4

# SLIDE PARTS AND EQUIPMENT INCLUDING SAME

CLAIM OF PRIORITY

The present application claims priority from Japanese patent application serial no. 2010-246143 filed on Nov. 2, 2010, the content of which is hereby incorporated by reference into this application.

BACKGROUND OF THE INVENTION

1. Field of the Invention

The present invention relates to a slide part in which a hard member is in sliding contact with a seal member formed of an elastic body, and more particularly, to a slide part having an amorphous carbon coating formed on a sliding surface of the hard member and equipment including the invented slide part.

2. Description of Related Art

Slide parts with amorphous carbon coatings formed on their sliding surfaces have been under intense research and development in order primarily to lower friction at sliding points of automobile parts or the like. Thin film materials referred to as a-C (amorphous carbon), a-C:H (hydrogenated amorphous carbon), i-C (i-carbon), DLC (diamond-like carbon), hard carbon, etc. are commonly used for amorphous carbon coatings.

An amorphous carbon coating is a structure including both $sp^2$ and $sp^3$ carbon-carbon bonds and has no clear crystalline structure (no grain boundaries). It features high hardness, high toughness, and low friction properties. Also, amorphous carbon coatings are considered to be superior to crystalline hard coatings such as TiN (titanium nitride) coatings and CrN (chromium nitride) coatings in terms of resistance to mechanical wear.

Some slide parts slide in contact with a seal member (make sliding contact with a seal member). When such a seal member is for sealing a fluid and is formed of an elastic body such as resin and rubber, in particular, the friction coefficient on the sliding surface (sliding contact surface) is generally high, and abrasion easily develops. Therefore, various techniques to improve durability (wear resistance) have been studied.

For example, JP-A 2003-185029 discloses a sliding structure, including a technique to form a DLC coating on a sliding contact region of a seal member which is in sliding contact with a slide part and generates a dynamic friction force. According to JP-A 2003-185029, it is possible to reduce wear (abrasion) in the seal member and in the slide part by taking advantage of the low friction properties of the DLC coating.

JP-A 2005-48801 discloses a sealed device, including a technique to form a hard carbon coating on a sliding contact surface of a seal member, or on sliding contact surfaces of both a seal member and a slide part, and to interpose a lubricant containing a specific friction modifier between the seal member and the slide part. According to JP-A 2005-48801, the sealed device exhibits high wear resistance and low frictional resistance.

JP-A 2009-169210 discloses an elastic roller for electrophotographic apparatuses, sides of the elastic roller being sealed by seal members, the elastic roller including a technique to form a DLC coating on sliding portions of the elastic roller in contact with the seal members. According to JP-A 2009-169210, the elastic roller exhibits both high sealing performance and high wear resistance.

JP-A 2006-189025 discloses a high-pressure plunger pump which sucks and discharges slurry containing atomized powder, the plunger pump including a technique to form a DLC coating on an outer peripheral surface of a plunger in the plunger pump in order to smooth the outer peripheral surface of the plunger and reduce the friction coefficient thereon. According to JP-A 2006-189025, it is possible to inhibit build-up of atomized powder on the outer peripheral surface of the plunger and improve the wear resistance of the plunger and a gasket.

JP-A 2004-137507 discloses a method for producing automotive parts, the method subjecting a surface of an automotive sealing component, the automotive sealing component being formed of rubber, resin, or the like, to a predetermined pretreatment and then forming a DLC coating thereon. According to JP-A 2004-137507, it is possible to provide automotive sealing components having good slidability on other articles, excellent in wear resistance and hardly deteriorating.

Meanwhile, various amorphous carbon coatings containing a ternary element that is neither carbon nor hydrogen have been proposed. For example, JP-A 2000-297373 discloses a sliding member used in a lubricant, the sliding member including a technique to form a surface layer of the slide member with at least a hard carbon coating, the hard carbon coating containing nitrogen and/or oxygen in the surface thereof. According to JP-A 2000-297373, the sliding member exhibits low friction properties and high wear resistance.

JP-A 2003-336542 discloses a slide member which slides in a presence of a lubricant, the slide member including a technique to cover a sliding surface of the slide member with a DLC coating containing silicon. According to JP-A 2003-336542, the slide member exhibits high wear resistance and high seizure resistance.

JP-A 2005-282668 discloses a connection jig entirely or partly covered with a hard coating of boron carbonitride having at least one of a diamond-like structure and a graphite-like structure. According to JP-A 2005-282668, it is possible to reduce the frictional resistance on a connection sliding surface of the connection jig.

However, in a conventional slide part/member in sliding contact with a seal member formed of an elastic body such as resin and rubber, the amorphous carbon coating thereof can wear more than expected due to the high friction coefficient on the sliding surface. In other words, conventional amorphous carbon coatings have poor durability (wear resistance) in slide parts in sliding contact with a seal member, and further improvements are required.

SUMMARY OF THE INVENTION

In view of the foregoing, it is an objective of the present invention to address the above-described problem and provide a slide part in which a seal member formed of an elastic body is in sliding contact with a hard member, the slide part having a higher wear resistance (durability) over the prior art. Furthermore, it is another objective of the invention to provide equipment including the invented slide part.

(I) According to one aspect of the present invention, there is provided a slide part which includes: a hard member having an amorphous carbon coating containing nitrogen (N) formed on an outermost surface of a substrate; and a seal member formed of an elastic body, the seal member being in sliding contact with the hard member. In the amorphous carbon coating, content of the nitrogen is equal to or more than 3 atomic percentage (at. %) and equal to or less than 25 at. %, taking a total content of the carbon (C) and the nitrogen in the amorphous carbon coating as 100 at. %. The seal member contains fluorine (F) at least in a sliding contact surface region thereof. Furthermore, content of the fluorine in the sliding contact surface region of the seal member is equal to or more than the nitrogen content in the amorphous carbon coating.

(II) According to another aspect of the present invention, there is provided a slide part which includes: a hard member having an amorphous carbon coating containing nitrogen and boron (B) formed on an outermost surface of a substrate; and a seal member formed of an elastic body, the seal member being in sliding contact with the hard member. In the amorphous carbon coating, content of the nitrogen is equal to or more than 3 at. % and equal to or less than 45 at. %, taking a total content of the carbon, the nitrogen and the boron in the amorphous carbon coating as 100 at. %. A ratio between the nitrogen content [N] and the boron content [B] satisfies "$0.95 \leq [B]/[N] \leq 1.05$". The seal member contains fluorine at least in a sliding contact surface region thereof. Furthermore, content of the fluorine in the sliding contact surface region of the seal member is equal to or more than the nitrogen content in the amorphous carbon coating.

In the above-described aspects (I) and (II) of the invention, the following improvements and modifications can be made:

(i) The nitrogen content in the amorphous carbon coating is equal to or more than 6 at. % and equal to or less than 22 at. %.

(ii) In the case that the amorphous carbon coating contains boron, the nitrogen content of the amorphous carbon coating is equal to or more than 12 at. % and equal to or less than 45 at. %.

(iii) A plurality of interlayers are provided between the amorphous carbon coating and the substrate of the hard member, the plurality of interlayers including: a first interlayer formed of at least one element selected from silicon (Si), chromium (Cr), titanium (Ti) and tungsten (W) immediately on the substrate; and a second interlayer formed of the element(s) composing the first interlayer and the elements composing the amorphous carbon coating immediately on the first interlayer. Furthermore, the second interlayer is formed such that the content of the element composing the first interlayer gradually decreases as the content of the elements composing the amorphous carbon coating gradually increases.

(iv) Equipment including any slide part of the above, in which the seal member seals a fluid comprising a gas phase and/or a liquid phase.

(v) A plunger pump including any slide part of the above, in which: the hard member is a plunger; and the seal member is a ring seal in sliding contact with the plunger.

(vi) A method for manufacturing the hard member, the method comprising the step of forming the amorphous carbon coating on the outermost surface of the substrate by reactive sputtering using an unbalanced magnetron sputtering device, in which: a graphite target is used as a carbon component supply source; a nitrogen gas and/or an ammonia gas is used as a nitrogen component supply source; and a boron carbide target or a boron nitride target is used as a boron component supply source as needed.

Advantages of the Invention

According to the present invention, it is possible to provide a slide part in which a hard member is in sliding contact with a seal member formed of an elastic body, the slide part having higher wear resistance (durability) over the prior art, and to provide equipment including the invented slide part.

DETAILED DESCRIPTION OF THE PREFERRED EMBODIMENTS

The inventor first conducted verification experiments on conventional techniques. According to the study and examination by the inventor, an endurance test (wear resistance test) in which a pseudo high-pressure plunger pump was used demonstrated that a plunger having a conventional amorphous carbon coating on the surface thereof wore more on its sliding surface with an elastic seal than on its sliding surface with a metal cylinder (which will be described in detail later).

(Basic Concept of Invented Slide Part)

Generally, a friction coefficient is proportional to the product of a true area of contact $A_R$ and a shear stress S required to shear adhesion per unit area (Amontons-Coulomb's law). In sliding contact with a seal member formed of an elastic body, it is considered that since the sliding member is pressed to secure sufficient sealing, $A_R$ tends to become large, resulting in a high friction coefficient. In addition, the sliding surface tends to become hot due to frictional heat.

Also, an amorphous carbon coating is known to change into a microstructure, which is thermodynamically stabler but mechanically weaker, in a high-temperature environment (e.g., 350° C. or higher). In other words, it is feared that the surface of an amorphous carbon coating may weaken due to frictional heat during a sliding operation. Meanwhile, structural change in an amorphous carbon coating can be suppressed by incorporating nitrogen atoms into the amorphous carbon coating so that some of the bonds between carbon atoms that compose the amorphous carbon coating (C—C bonds) are replaced with carbon-nitrogen single bonds (C—N bonds) or carbon-nitrogen double bonds (C=N bonds), thereby improving the heat resistance of an amorphous carbon coating.

On the other hand, academic papers by Kato et al. and Miyahira et al. report that although amorphous carbon coatings containing nitrogen (also called amorphous carbon nitride coatings or $CN_x$) exhibit higher friction properties than common amorphous carbon coatings (containing no nitrogen) in the air atmosphere, they exhibit specific low friction properties in a nitrogen gas ($N_2$) or argon gas (Ar) atmosphere.

Koji Kato et al.: "Friction, Wear and $N_2$-Lubrication of Carbon Nitride Coatings: a Review", Wear 254 (2003) 1062-1069.

Yuki Miyahira et al.: "Effect of Transfer Layer and Lightening on Friction of $CN_N$", Proceedings of JAST Tribology Conference (in Japanese), 2010-9 (2010), pp. 77-78.

The mechanism that brings about the low friction properties has not been clarified yet. However, Miyahira et al. report that when an amorphous carbon nitride coating slides in a nitrogen gas or argon gas atmosphere, energy generated during the sliding operation might ionize the nitrogen component in the coating and the nitrogen or argon in the atmosphere, and they might repel each other within the sliding surface. Also, according to Miyahira et al., no lightening (luminous phenomenon) that indicates ionization was observed in a sliding operation in the air atmosphere.

While the results of the experiments conducted by Kato et al. and Miyahara et al. are very interesting, it is difficult to control the environment in which a slide part is actually used so that the atmosphere is a nitrogen gas or argon gas, and so these experimental results cannot be made use of as they are. Therefore, the inventor devised the following model, focusing on the fact that nitrogen and argon are elements having a high first ionization energy.

Elements having a high ionization energy are relatively stable and their ionization states are maintained once they obtain energy and are ionized. If elements having a high ionization energy can be incorporated into the two solids sandwiching a sliding surface, these elements will absorb heat energy due to friction and be ionized, making it possible to reduce friction on the sliding surface using the repulsive force between the ions. More specifically, the inventor contemplated incorporating elements having a high ionization energy into the surface of an elastic body in sliding contact with an amorphous carbon coating containing nitrogen. Also, if frictional heat is absorbed due to ionization, it is expected that the temperature rising on the sliding surface and the accompanying structural change of an amorphous carbon coating will be suppressed.

It is known that comparison of first ionization energies of elements indicates the following: He (helium)>Ne (neon)> F>Ar>N>Kr (krypton)>O (oxygen). Among these elements, the rare gas elements (He, Ne, Ar, and Kr) each have a closed-shell electronic structure, and so it is difficult to incorporate these rare gas elements into the molecular structure of a solid. This leaves fluorine, nitrogen, and oxygen as candidates for incorporation.

Next, there will be discussed compatibility of these elements with a seal member into which the elements are to be incorporated and with an amorphous carbon coating which is a mating member of the seal member. Since a seal member is usually formed of an elastic body such as resin and rubber, doping oxygen can damage the elasticity of a seal member and therefore is not preferred. Regarding doping nitrogen, the relationship between the nitrogen contained in a seal member and the nitrogen contained in an amorphous carbon coating in sliding contact with the seal member should be considered. In the case of nitrogen-nitrogen combination, the nitrogen ions produce nitrogen molecules ($N_2$) and can depart from the sliding surface. Therefore, in order to maintain the repulsive force between the ions, a large amount of nitrogen atoms need to be supplied continuously. This can explain the results of the experiments conducted by Kato et al. and Miyahira et al. (that although amorphous carbon coatings containing nitrogen exhibit low friction properties in a nitrogen gas atmosphere, they do not in the air atmosphere).

Meanwhile, not only is fluorine compatible with resin and rubber, but fluorine ions do not easily combine with nitrogen ions, which means that fluorine ions and nitrogen ions can exist stably on the sliding surface. Therefore, the inventor considers fluorine to be the most suitable element for doping. The present invention has been completed through experimental demonstration based on these inventive concepts.

Preferred embodiments of the present invention will be described hereinafter with reference to the accompanying drawings. However, it should be noted that the present invention is not limited to the embodiments described herein, and appropriate combinations and modifications may be implemented without changing the gist of the invention.

[Hard Member]
(Configuration of Amorphous Carbon Coating)

In order to obtain low friction properties on a sliding surface, the concentration of nitrogen contained in an amorphous carbon coating is preferably equal to or more than 3 atomic percentage (at. %), taking the total concentration of the carbon and the nitrogen in the amorphous carbon coating as 100 at. %. While low friction properties can be obtained by setting the nitrogen concentration at equal to or more than 3 at. %, the nitrogen concentration is preferably equal to or more than 6 at. % in order to obtain better low friction properties. On the other hand, since the hardness of an amorphous carbon coating tends to decrease as more nitrogen is doped thereto, when nitrogen alone is doped to an amorphous carbon coating (i.e., when boron is not co-doped: an amorphous carbon nitride coating), the nitrogen concentration is preferably equal to or less than 25 at. %. This makes it possible to obtain a Vickers hardness Hv of equal to or higher than 1000. Also, in order to obtain a Vickers hardness of equal to or higher than 1500 Hv, the nitrogen concentration is preferably equal to or less than 22 at. %.

As described above, if the mechanism of reducing friction is attributable to the repulsive force between ions on the sliding surface, a higher concentration of nitrogen contained in the amorphous carbon coating is expected to further reduce friction. Meanwhile, in order to obtain excellent wear resistance, the hardness of a coating is preferably high. However, the hardness of an amorphous carbon tends to decrease as more nitrogen is doped thereto. One way to solve these contradicting phenomena is co-doping an amorphous carbon coating with nitrogen and boron. As with a common amorphous carbon coating, an amorphous carbon coating containing both nitrogen and boron (amorphous carbon nitride boride coating) has the properties of an amorphous (non-crystalline) structure comprising $sp^2$ and $sp^3$ electronic structures and is high in hardness due to the strong bonding between nitrogen and boron. As a result, an amorphous carbon nitride boride coating can maintain a Vickers hardness of equal to or higher than 2000 Hv even if the concentration of nitrogen in the coating is increased to 45 at. %.

The ratio between the nitrogen concentration [N] and the boron concentration [B] of an amorphous carbon nitride boride coating is preferably as close as possible to 1:1 and at least is required to satisfy "$0.95 \leq [B]/[N] \leq 1.05$", more preferably "$0.97 \leq [B]/[N] \leq 1.03$". Deviation of the [B]/[N] ratio from "$0.95 \leq [B]/[N] \leq 1.05$" is not preferred because it reduces the hardness (the Vickers hardness falls below 1000 Hv). In order to obtain a Vickers hardness of equal to or higher than 1500 Hv, the ratio preferably satisfies "$0.97 \leq [B]/[N] \leq 1.03$". More specifically, the nitrogen concentration is preferably equal to or more than 3 at. % and equal to or less than 45 at. %, and the boron concentration is preferably equal to or more than 2.8 at. % and equal to or less than 47.3 at. %. Regarding component concentrations of an amorphous carbon nitride boride coating in accordance with the present invention, it is assumed that the total of carbon, nitrogen and boron is 100 at. %.

Since amorphous carbon nitride coatings and amorphous carbon nitride boride coatings in accordance with the present invention are amorphous structures, they feature high toughness and high surface smoothness. Also, since they are microstructures comprising $sp^2$ and $sp^3$ bonds, they have high hardness properties. These microstructures can be analyzed by Raman spectroscopy, electron energy loss spectroscopy (EELS), X-ray diffraction (XRD), electron diffraction (LEED/RHEED), X-ray photoelectron spectroscopy (XPS), nuclear magnetic resonance (NMR), or the like. Although there is no particular limitation on coating thickness, amorphous carbon coatings having a thickness ranging from 1 to 10 μm, for example, are preferably used.

Amorphous carbon coatings in accordance with the present invention may contain hydrogen or argon as an unavoidable element in manufacturing. In such cases, it is preferred to control the hydrogen concentration and the argon concentration to equal to or less than 25 at. % and equal to or less than 15 at. %, respectively. Inclusion of hydrogen or argon in an amount exceeding its specified range mentioned above is not preferred because it weakens the amorphous carbon coating. Also, exposure of an amorphous carbon coating formed to the air atmosphere may lead to oxygen intrusion due to surface oxidation or the like. In such a case, it is preferred to control the oxygen concentration on the outermost surface to equal to or less than 10 at. %. By doing so, the oxygen concentration at approximately 0.1 μm deep to the surface can be controlled to equal to or less than 2 at. %. An oxygen concentration within this range does not adversely affect the properties of the amorphous carbon coating. Herein, as mentioned above, respective concentration figures are based on the assumption that the total of carbon and nitrogen is 100 at. % in the case of an amorphous carbon nitride coating, and the total of carbon, nitrogen and boron is 100 at. % in the case of an amorphous carbon nitride boride coating.

(Substrate)

In the present invention, there is no particular limitation on a material of a substrate on which an amorphous carbon coating is formed. Considering durability and the like, however, a ferrous material, an aluminum material, an engineering plastic, a ceramic, etc. may be preferably used. In the case of using a ferrous material as a substrate, a hard ferrous material is preferably used in order to increase coating adhesion. Also, a soft ferrous material that has been hardened with a pretreatment such as nitriding, carburizing and carbonitriding may be used as a substrate. When the surface roughness of a substrate is equal to or more than 1/10 of the thickness of the coating to be formed thereon, the coating cannot exhibit the low friction properties thereof to the fullest. Therefore, it is desirable that the surface of a substrate be subjected to finishing processing (e.g., the average surface roughness Ra of equal to or less than 0.1 μm).

(Interlayers)

Although a hard member in accordance with the present invention may be composed of a substrate and an amorphous carbon coating formed immediately thereon, interlayers are preferably provided in order to improve the adhesion between the substrate and the amorphous carbon coating. It is desirable that such interlayers comprise: a first interlayer formed of at least one element selected from silicon (Si), chromium (Cr), titanium (Ti), and tungsten (W) immediately on the substrate; and a second interlayer formed of the element(s) composing the first interlayer and the elements composing the amorphous carbon coating immediately on the first interlayer. The second interlayer is formed such that the content of the at least one element composing the first interlayer gradually decreases as the content of the elements composing the amorphous carbon coating gradually increases in the second interlayer. In other words, the second interlayer grows more similar in composition toward the amorphous carbon coating. The above-described multi-layer structure relaxes the internal stress of the amorphous carbon coating and improves the adhesion between the substrate and the amorphous carbon coating, thereby preventing interfacial debonding and further improving durability.

(Method for Manufacturing Amorphous Carbon Coating)

An amorphous carbon coating in accordance with the present invention may be manufactured by an existing method such as sputtering, plasma enhanced CVD, and ion-plating. Especially, reactive sputtering is desirable. A coating formed by reactive sputtering has a smooth surface, and reactive sputtering is a method for easily forming an amorphous carbon coating in which a doped element and carbon are combined. Also, by performing reactive sputtering using nitrogen gas or ammonia gas as a nitrogen supply source, a harder coating can be formed.

In performing reactive sputtering, an unbalanced magnetron sputtering device is preferably used. In the case of using a conventional sputtering device, plasma is excited mainly near a target, and it is difficult to keep plasma in a highly excited state near a substrate to be coated. In contrast, in reactive sputtering using an unbalanced magnetron sputtering device, the density of plasma can be increased nearer to a substrate. To control plasma, argon gas is usually used.

In the case of forming an amorphous carbon nitride coating, it is desirable to use a graphite target as a carbon supply source, and nitrogen gas and/or ammonia gas as a nitrogen supply source. A hydrocarbon may also be used as another carbon supply source in combination with a graphite target.

On the other hand, in the case of forming an amorphous carbon nitride boride coating, the boron component can be supplied from a gas material, but it is desirable that it be supplied from a solid target such as a boron carbide target and a boron nitride target. Also, it is desirable to control the proportion between carbon and boron in the coating by using a graphite target in combination with a boron-containing target. As a nitrogen supply source, it is desirable to use nitrogen gas and/or ammonia gas. The boron concentration and the nitrogen concentration must be controlled to satisfy a predetermined ratio. In addition, a hydrocarbon may also be used as another carbon supply source in combination with a graphite target.

[Seal Member]

In a slide part in accordance with the present invention, it is desirable that a seal member in sliding contact with the hard member described above contains fluorine at least in the sliding contact surface region thereof, and that the fluorine content of the seal member be equal to or more than the nitrogen content of the amorphous carbon coating. As described above, if the mechanism of reducing friction is attributable to the repulsive force between ions on the sliding surface, approximately equivalent amounts of ions generated from the two sliding surfaces of respective solids sandwiching the sliding interface are expected to further reduce friction. Although the valence of nitrogen ions on the sliding surface is not known, considering that fluorine ions are normally monovalent ions, it is desirable that the fluorine content be equal to or more than the nitrogen content.

One way to incorporate fluorine into the surface region of a seal member formed of an elastic body is to use a fluororesin or a fluororubber as the elastic body. Fluororesins containing enough fluorine include polytetrafluoroethylene, fluorinated ethylene-propylene copolymers, polychlorotrifluoroethylene, polyvinylidene fluoride, and polyvinyl fluoride. Fluororubbers include fluorinated acrylate polymers, fluorinated ester polymers, trifluoride polymers, hexafluoride polymers, and fluorinated silicone polymers.

Another way to incorporate fluorine into the surface region of a seal member is to complex particles of a fluorinated compound with the elastic body. In this case, it is desirable to adjust the content of the fluorinated compound particles so that the average fluorine concentration on the surface of the seal member is equal to or more than the nitrogen concentration of the amorphous carbon coating. The particles of the fluorinated compound are preferably small in size (e.g., equal to or smaller than 100 μm in diameter) and uniformly dispersed in the surface region. Fluorinated compounds that may be complexed include, but are not limited to, calcium fluoride, aluminum fluoride, sodium fluoride, and fluorine-based resin. Also, elastic bodies to be used as a base material (matrix) include polyethylene, cross-linked polyethylene, chlorinated polyethylene, ethylene-vinyl acetate copolymers, polyethylene terephthalate, polypropylene, polyisobutylene, polyvinyl chloride, polyvinylidene chloride, polyvinyl acetate, polyvinyl alcohol, polyvinyl acetal, fluororesin, acrylic resin, polyacrylonitrile, polystyrene, acetal resin, polyamide, polycarbonate, cellulosic plastic, styrene-acrylonitrile copolymers, acrylonitrile butadiene styrene tri-copolymers, phenolic resin, urea resin, epoxy resin, unsaturated polyester resin, alkyd resin, melamine resin, silicon resin, polyurethane, diallyl phthalate resin, natural rubber, acrylic rubber, nitrile rubber, isoprene rubber, urethane rubber, ethylene-propylene rubber, epichrolohydrin rubber, chloroprene rubber, silicone rubber, styrene-butadiene rubber, butadiene rubber, and fluororubber.

Yet another way to incorporate fluorine into the surface region of a seal member is to fluorinate the surface region of the elastic body. In this case, it is desirable that fluorine intrudes to a depth of equal to or more than 0.1 μm into the surface of the seal member. It is also desirable to adjust the fluorine concentration on the surface of the seal member to equal to or more than the nitrogen concentration of the amorphous carbon coating. Ways to fluorinate the surface of the elastic body include heat treatment in a chamber filled with a fluorine-containing gas and exposure to a fluorine-containing plasma.

In order to adjust the hardness of a seal member, a filler may be mixed into the elastic body. Although there is no particular limitation on the kind of filler, fillers that may be used include silica, carbon fibers, glass fibers, graphite, plastics, metals, and alloys. Also in the case of using a filler, it is desirable to adjust the fluorine concentration on the surface of the seal member to equal to or more than the nitrogen concentration of the amorphous carbon coating.

[Slide Part and Equipment Including the Same]

There is no particular limitation on a kind of machinery parts as a slide part in accordance with the present invention as long as its seal member formed of an elastic body seals a fluid, and its hard member slides in contact with the seal member. A slide part of the invention is preferably used as a slide part for a pump, a rotating part for an electric motor, a slide part for a brake, a slide part for a wiper, a slide part for a vacuum device, etc. It is particularly useful as a slide part in which a hard member slides in contact with a seal member being pressed against the hard member under high surface pressure and for equipment including the same. One example is a high-pressure plunger pump used as a fuel pump in an internal combustion engine.

A high-pressure plunger pump permits high-pressure fuel supply by the piston motion of a plunger. In a high-pressure plunger pump, the portion sealing a fuel or a lubricant is composed of a cylindrical plunger and a ring seal member adhered thereto. The surface pressure of the ring seal member can exceed 1 MPa, and the sliding velocity of the plunger can exceed 1 m/s on the sliding contact surface between the plunger and the ring seal member. Therefore, both good sealing properties and high seizure resistance over a long period of time are strongly required in a high-pressure plunger pump. Low friction properties and wear resistance on a sliding contact surface can be secured by applying the present invention to a high-pressure plunger pump, and so there can be provided a high-pressure plunger pump having excellent durability.

EXAMPLES

Tangible embodiments of the present invention will be hereinafter described in detail by examples. It should be noted, however, that the present invention is not limited to the following examples.

In order to conduct a ring-on-plate frictional wear test, various coatings were formed on the sliding surfaces of ring specimens (ring end faces) to fabricate test samples. The frictional wear test was conducted on these test samples and various plate specimens, and the properties of each coating were examined. First, the method for conducting the frictional wear test will be described.

(Frictional Wear Test)

Figure 1:
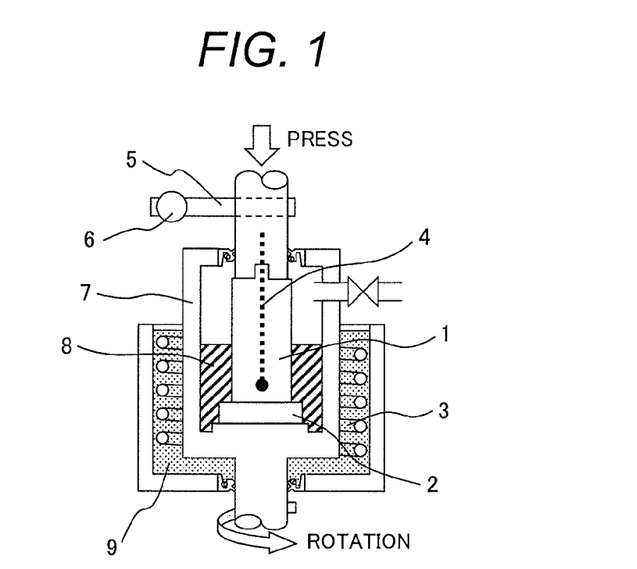
FIG. 1 is a schematic cross-sectional diagram outlining the frictional wear test.

Ring on Plate Friction Tester (a product of Orientech Co., Ltd., model: EFM-III) was used as the testing device for the frictional wear test. FIG. 1 is a schematic cross-sectional diagram outlining the frictional wear test. As shown in FIG. 1, the frictional wear testing device was composed of a ring specimen 1, a plate specimen 2, a heater 3, a thermo couple 4, a torque measurement arm 5, load cell 6, a tub 7, an immersion solution 8, and a moisturizing oil 9. A gas-nitrided ferrous material (SKD10) was used as the substrate of the ring specimen 1, which had a coating formed on the ring end face, as a sliding surface, thereof. The plate specimen 2 was the sliding mating member of the ring specimen 1.

The test procedure was as follows. First, the ring specimen 1 and the plate specimen 2 were placed in the tub 7 filled with unleaded gasoline as the immersion solution 8 such that the ring end face of the ring specimen 1 and the plate specimen 2 were in surface contact with each other. Next, the ring specimen 1 was rotated at a circumferential velocity of 0.5 m/s while the plate specimen 2 was pressed at a pressure increasing by 10 MPa every two minutes from 0 to 150 MPa. The pressure was kept at 150 MPa for 10 hours. Also, the test temperature was measured by the thermo couple 4 hanging in the center of the ring specimen 1 and adjusted to 90° C. by the heater 3.

Example 1

Preparation of Sample 1

As described above, a gas-nitrided ferrous material (SKD10) was used as the substrate of ring specimens. The ring end face, as a sliding surface, of each ring specimen was subjected to finish processing so that the average surface roughness Ra would become 0.02 μm. Then an amorphous carbon nitride coating was formed on the ring end face in the following procedure.

A ring specimen substrate, a chrome target, and a graphite target were placed in an unbalanced magnetron sputtering device. First, while argon gas was flowed into the device, electric power was applied to the chrome target to form a first interlayer (0.1 μm in thickness) on the surface of the ring specimen substrate. Subsequently, while hydrocarbon gas and nitrogen gas were flowed into the device in addition to argon gas, electric power was applied to the graphite target to form a second interlayer (0.2 μm in thickness). In forming the second interlayer, the target electric power and the gas flow rates were adjusted such that the chrome concentration gradually decreases as the carbon concentration and the nitrogen concentration gradually increases. Then, the electric power to the chrome target was interrupted, and while argon gas, hydrocarbon gas, and nitrogen gas were continuously flowed into the device, electric power was continuously applied to the graphite target to form an amorphous carbon nitride coating (1.7 μm in thickness) having a nitrogen concentration of 3 at. %.

The average surface roughness Ra of the amorphous carbon nitride coating thus formed was measured to be 0.02 μm, which was the same as that of the ring specimen substrate. Also, a compositional analysis of the amorphous carbon nitride coating by X-ray photoelectron spectroscopy revealed that the atomic concentration ratio of carbon to nitrogen was nearly equal to 97:3, indicating that a desired composition had been obtained.

Preparation of Samples 2 to 5

In the same procedure as with Sample 1, an amorphous carbon nitride coating having a nitrogen concentration of 6 at. % (Sample 2), an amorphous carbon nitride coating having a nitrogen concentration of 10 at. % (Sample 3), an amorphous carbon nitride coating having a nitrogen concentration of 22 at. % (Sample 4), and an amorphous carbon nitride coating having a nitrogen concentration of 30 at. % (Sample 5) were each formed on a ring specimen substrate with interlayers in between. The average surface roughness Ra of each sample was measured to be 0.02 μm, and a composition analysis of each sample revealed that a desired composition had been obtained.

Preparation of Samples 6 to 10

Amorphous carbon nitride boride coatings different in composition were each formed on interlayers (a first interlayer and a second interlayer) formed in the same procedure as with Sample 1 on a ring specimen substrate using an unbalanced magnetron sputtering device. Three kinds of targets, a chrome target, a graphite target, and a boron carbide target, were used. In forming each amorphous carbon nitride boride coating, the nitrogen concentration [N] and the boron concentration were controlled such that the relationship between the nitrogen concentration [N] and the boron concentration [B] satisfies "$0.95 \leq [B]/[N] \leq 1.05$".

A compositional analysis of each sample revealed that an amorphous carbon nitride boride coating having a nitrogen concentration of 3 at. % (Sample 6), an amorphous carbon nitride boride coating having a nitrogen concentration of 12 at. % (Sample 7), an amorphous carbon nitride boride coating having a nitrogen concentration of 22 at. % (Sample 8), an amorphous carbon nitride boride coating having a nitrogen concentration of 40 at. % (Sample 9), and an amorphous carbon nitride boride coating having a nitrogen concentration of 45 at. % (Sample 10) had been obtained. Also, the average surface roughness Ra of each sample was 0.02 μm.

Preparation of Samples 11 to 13

A conventional amorphous carbon coating containing neither nitrogen nor boron (Sample 11) was formed on interlayers (a first interlayer and a second interlayer) formed in the same procedure as with Sample 1 on a ring specimen substrate using an unbalanced magnetron sputtering device. Also, a TiN coating having a thickness of 2.0 μm (Sample 12) was formed on a ring specimen substrate using an arc ion plating system. In addition, a ring specimen having no coating formed thereon (Sample 13) was prepared. A compositional analysis of Sample 12 revealed that its nitrogen concentration was 50 at. %. The average surface roughness Ra of Sample 11 was measured to be 0.02 μm, and the average surface roughness Ra of Sample 12 was measured to be 0.06 μm.

(Microstructural Analysis)

A microstructural analysis was conducted on each of the coatings thus formed by use of electron diffraction patterns obtained by a transmission electron microscope. The amorphous carbon nitride coatings (Samples 1 to 5), the amorphous carbon nitride boride coatings (Samples 6 to 10), and the amorphous carbon coating (Sample 11) each showed a halo pattern indicative of an amorphous structure. Also, an analysis of the carbon spectrums obtained by X-ray photoelectron spectroscopy revealed that peaks indicative of an $sp^2$ electronic structure and an $sp^3$ electronic structure appeared in Samples 1 to 11. These analytical results demonstrated that Samples 1 to 11 were amorphous carbon coatings containing $sp^2$ and $sp^3$ bonds (so-called DLC coatings). On the other hand, the TiN coating (Sample 12) showed a clear diffraction pattern in electron diffraction by a transmission electron microscope, indicating that it was a crystalline coating.

(Relationship Between Nitrogen Concentration and Hardness of Amorphous Carbon Coating)

The nano-indenter hardness $H_{IT}$ of each coating thus formed was measured using a nano-indentation tester and converted into a Vickers hardness Hv by a conversion formula: "$Hv=0.0926 \times H_{IT}$".

Figure 2:
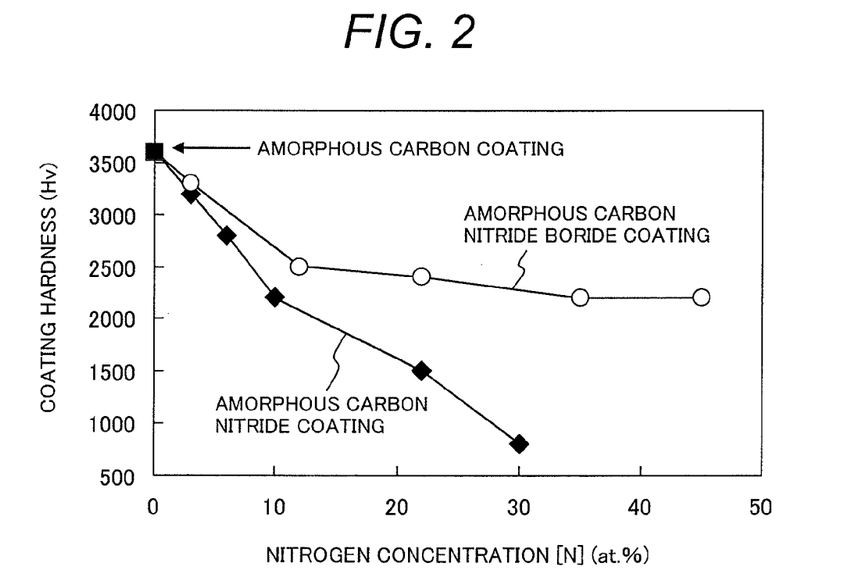
FIG. 2 is a graph showing a relationship between a nitrogen concentration and a hardness of each amorphous carbon coating.

FIG. 2 is a graph showing a relationship between a nitrogen concentration and a hardness of each amorphous carbon coating. As shown in FIG. 2, the hardness of the amorphous carbon nitride coatings (Samples 1 to 5) decreased relatively largely with increasing the nitrogen content. The hardness of the coating having a nitrogen concentration of 30 at. % (Sample 5) fell below 1000 Hv. On the other hand, the hardness of each of the amorphous carbon nitride boride coatings (Samples 6 to 10) gradually decreased with increasing the nitrogen content. Even the coating having a nitrogen concentration of 45 at. % (Sample 10) exhibited a hardness of as high as 2200 Hv. Meanwhile, the hardness of the TiN coating (Sample 12) was 1800 Hv.

A hard coating is required to have a Vickers hardness of at least 1000 Hv (1500 Hv or more is desirable) in order to maintain wear resistance. From this point of view, the following can be said: an amorphous carbon nitride coating desirably have a nitrogen concentration of equal to or less than 25 at. %, or more desirably equal to or less than 22 at. %, while an amorphous carbon nitride boride coating may have a nitrogen concentration of up to 45 at. %. Also, it was separately observed that deviation of the ratio between the nitrogen concentration [N] and the boron concentration [B] from "$0.95 \leq [B]/[N] \leq 1.05$" caused the hardness to fall below 1000 Hv. It was also observed that a Vickers hardness of equal to or higher than 1500 Hv was obtained when the [B]/[N] ratio satisfied "$0.97 \leq [B]/[N] \leq 1.03$".

The properties of each sample are shown in Table 1.

TABLE 1

Properties of Coatings.

| Sample No. | Coating Type | Nitrogen Concentration | Average Surface Roughness | Hardness |
|---|---|---|---|---|
| Sample 1 | Amorphous | 3 at. % | 0.02 μm | 3200 Hv |
| Sample 2 | Carbon | 6 at. % | | 2800 Hv |
| Sample 3 | Nitride | 10 at. % | | 2200 Hv |
| Sample 4 | | 22 at. % | | 1500 Hv |

TABLE 1-continued

Properties of Coatings.

| Sample No. | Coating Type | Nitrogen Concentration | Average Surface Roughness | Hardness |
|---|---|---|---|---|
| Sample 5 | | 30 at. % | | 800 Hv |
| Sample 6 | Amorphous | 3 at. % | | 3300 Hv |
| Sample 7 | Carbon | 12 at. % | | 2500 Hv |
| Sample 8 | Nitride Boride | 22 at. % | | 2400 Hv |
| Sample 9 | | 40 at. % | | 2200 Hv |
| Sample 10 | | 45 at. % | | 2200 Hv |
| Sample 11 | Amorphous Carbon | 0 at. % | | 3600 Hv |
| Sample 12 | TiN | 50 at. % | 0.06 μm | 1800 Hv |
| Sample 13 | None | — | 0.02 μm | — |

Example 2

Relationship Between Nitrogen Concentration and Friction Coefficient of Amorphous Carbon Coating In order to improve the durability (wear resistance) of a slide part, it is indispensable to reduce the friction coefficient between its sliding members. Therefore, the inventor conducted a frictional wear test on various combinations of the ring specimens and plate specimens fabricated in Example 1 and measured the friction coefficient of each combination. As the materials of the plate specimens, polytetrafluoroethylene (PTFE) was selected as a fluorine-containing resin material, and natural rubber (NR), polypropylene (PP), and a ferrous material (SKD10) were selected as materials containing no fluorine. The measurement results are shown in Table 2.

TABLE 2

Relationship between Nitrogen Concentration and Friction Coefficient of Amorphous Carbon Coating.

| | Sample No. | Nitrogen Concentration | Plate Specimen | Friction Coefficient |
|---|---|---|---|---|
| Example 2-1 | Sample 1 | 3 at. % | PTFE | 0.08 |
| Example 2-2 | Sample 2 | 6 at. % | | 0.06 |
| Example 2-3 | Sample 3 | 10 at. % | | 0.05 |
| Example 2-4 | Sample 4 | 22 at. % | | 0.05 |
| Example 2-5 | Sample 6 | 3 at. % | | 0.09 |
| Example 2-6 | Sample 7 | 12 at. % | | 0.06 |
| Example 2-7 | Sample 8 | 22 at. % | | 0.05 |
| Example 2-8 | Sample 9 | 40 at. % | | 0.04 |
| Example 2-9 | Sample 10 | 45 at. % | | 0.03 |
| Comparative Example 2-1 | Sample 3 | 10 at. % | NR | 0.32 |
| Comparative Example 2-2 | | | PP | 0.27 |
| Comparative Example 2-3 | | | SKD10 | 0.12 |
| Comparative Example 2-4 | Sample 5 | 30 at. % | PTFE | 0.05 → 041 |
| Comparative Example 2-5 | Sample 10 | 45 at. % | NR | 0.35 |
| Comparative Example 2-6 | | | PP | 0.28 |
| Comparative Example 2-7 | | | SKD10 | 0.15 |
| Comparative Example 2-8 | Sample 11 | 0 at. % | PTFE | 0.15 |
| Comparative Example 2-9 | | | NR | 0.31 |
| Comparative Example 2-10 | | | PP | 0.28 |
| Comparative Example 2-11 | | | SKD10 | 0.10 |
| Comparative Example 2-12 | Sample 12 | 0 at. % | PTFE | 0.46 |
| Comparative Example 2-13 | | | NR | 0.58 |
| Comparative Example 2-14 | | | PP | 0.55 |
| Comparative Example 2-15 | | | SKD10 | 0.48 |
| Comparative Example 2-16 | Sample 13 | — | PTFE | 0.42 |

In Table 2, the value 0.10 of the friction coefficient of Comparative Example 2-11 (a combination of Sample 11 and a ferrous material) is generally said to be the value of the friction coefficient of a DLC coating. Also, as shown by Comparative Examples 2-8 to 2-10, it was revealed that Sample 11 (a common amorphous carbon coating) exhibited a higher friction coefficient in sliding with an elastic body. Since an objective of the present invention is to reduce friction in a slide part that slides against an elastic body, Comparative Example 2-8 (friction coefficient: 0.15), which was a combination of Sample 11 and an elastic body and exhibited the lowest friction coefficient with an elastic body, was used as a criterion. In other words, any combination exhibiting a friction coefficient lower than 0.15 was determined to indicate that the objective of reducing friction had been achieved.

The results shown in Table 2 demonstrated the following among other things:

(1) Amorphous carbon nitride coatings in accordance with the present invention (Samples 1 to 4) exhibited a reduced friction coefficient in sliding with a fluorine-containing elastic body although they exhibited a higher friction coefficient in sliding with an elastic body containing no fluorine or a ferrous material. Also, it was observed that coatings having a higher nitrogen content tended to have a lower friction coefficient. See Comparative Examples 2-1 to 2-3 and Examples 2-1 to 2-4.

(2) Similarly, amorphous carbon nitride boride coatings in accordance with the invention (Samples 6 to 10) exhibited a reduced friction coefficient in sliding with a fluorine-containing elastic body although they exhibited a higher friction coefficient in sliding with an elastic body containing no fluorine or a ferrous material. Also, it was observed that coatings having a higher nitrogen content tended to have a lower friction coefficient. See Comparative Examples 2-5 to 2-7 and Examples 2-5 to 2-9.

(3) A TiN coating (Sample 12) and a ferrous material having no coating (Sample 13) exhibited a high friction coefficient. See Comparative Examples 2-12 to 2-16.

(4) An amorphous carbon nitride coating that did not conform to the standards of the invention (Sample 5) exhibited an initial friction coefficient of as small as 0.05. However, the friction coefficient dramatically increased about three to four hours after the start of the test and remained at around 0.41 afterwards. See Comparative Example 2-4. After the test, there were wear scars left over the entire region of the sliding surface of the ring specimen, and the interlayers were exposed in various places. Moreover, even the ferrous substrate was partly exposed. This suggested that the friction coefficient increased because the coating wore due to the low hardness of Sample 5.

(Measurement of Wear Depth of Amorphous Carbon Coating)

The inventor examined the relationship between the wear depth and the nitrogen concentration of each amorphous carbon coating in the frictional wear test. The wear depth was calculated from the difference between the thickness of the worn coating left on the ring specimen after the frictional wear test and the thickness of the coating before the test. The following description will be based on the case where PTFE was used as the plate specimen.

Figure 3:
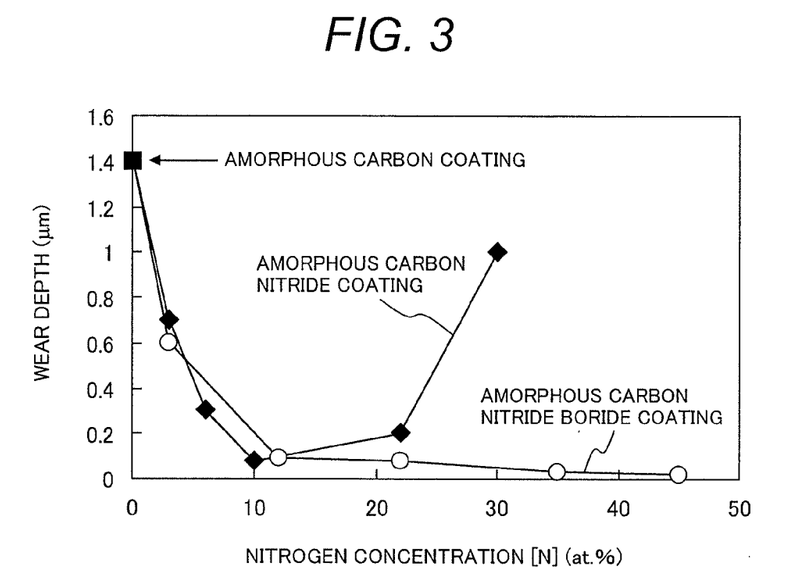
FIG. 3 is a graph showing a relationship between a nitrogen concentration and a wear depth of each amorphous carbon coating.

FIG. 3 is a graph showing a relationship between a nitrogen concentration and a wear depth of each amorphous carbon coating. As shown in FIG. 3, the wear depth of the common amorphous carbon coating (Sample 11) was about 1.4 µm. In contrast, the wear depth of the amorphous carbon nitride coatings dramatically decreased as the nitrogen concentration increased and friction was reduced. However, an excessive content of nitrogen reduced the hardness, increasing the wear depth. Similarly, the wear depth of the amorphous carbon nitride boride coatings dramatically decreased as the nitrogen concentration increased and friction was reduced. Also, excellent wear resistance was exhibited even when the nitrogen concentration was high. The amorphous carbon nitride coatings having a nitrogen concentration ranging from about 9 to about 18 at. % and the amorphous carbon nitride boride coatings having a nitrogen concentration ranging from 9 to 45 at. % had a wear depth of equal to or less than about 0.14 µm, indicating that they exhibited a wear resistance (i.e. durability) that was over ten times higher than that of the common amorphous carbon coating (Sample 11).

Example 3

Relationship Between Average Fluorine Concentration in Resin and Friction Coefficient Plate specimens different in average fluorine concentration in resin were prepared, and a frictional wear resistance test similar to the one described above was conducted to investigate the relationship between the average fluorine concentration in resin and the friction coefficient. As the ring specimens, Sample 3 (N concentration=10 at. %) and Sample 4 (N concentration=22 at. %) were used. As the plate specimens, PTFE (F concentration=67 at. %), PVDF (polyvinylidene fluoride, F concentration=33 at. %), PVF (polyvinyl fluoride, F concentration=17 at. %), PE (polyethylene, F concentration=0 at. %), and a copolymer having an adjusted average fluorine concentration were used. The results are shown in Table 3.

TABLE 3

Relationship between Average Fluorine Concentration in Resin and Friction Coefficient.

| Sample No. | Nitrogen Concentration in Coating | Plate Specimen | Nitrogen Concentration in Resin | Friction Coefficient |
|---|---|---|---|---|
| Example 3-1 | Sample 3 | 10 at. % | PTFE | 67 at. % | 0.05 |
| Example 3-2 | | | PVDF | 33 at. % | 0.06 |
| Example 3-3 | | | Copolymer | 23 at. % | 0.08 |
| Example 3-4 | | | PVF | 17 at. % | 0.10 |
| Example 3-5 | | | Copolymer | 10 at. % | 0.14 |
| Comparative Example 3-1 | | | Copolymer | 5 at. % | 0.28 |
| Comparative Example 3-2 | | | PE | 0 at. % | 0.32 |
| Example 3-6 | Sample 4 | 22 at. % | PTFE | 67 at. % | 0.05 |
| Example 3-7 | | | PVDF | 33 at. % | 0.06 |
| Example 3-8 | | | Copolymer | 23 at. % | 0.10 |
| Comparative Example 3-3 | | | PVF | 17 at. % | 0.22 |
| Comparative Example 3-4 | | | Copolymer | 10 at. % | 0.26 |
| Comparative Example 3-5 | | | Copolymer | 5 at. % | 0.29 |
| Comparative Example 3-6 | | | PE | 0 at. % | 0.35 |

As shown in Table 3, the amorphous carbon nitride of Sample 3 (N concentration=10 at. %) exhibited a high friction coefficient when the average fluorine concentration in resin was lower than 10 at. % (see Comparative Examples 3-1 and 3-2). However, the friction coefficient dramatically decreased when the average fluorine concentration in resin was 10 at. % (see Example 3-5), and it was observed that friction was reduced when the average fluorine concentration in resin was equal to or higher than 10 at. % (see Examples 3-1 to 3-5). Also, the amorphous carbon nitride of Sample 4 (N concentration=22 at. %) exhibited a high friction coefficient when the average fluorine concentration in resin was lower than 22 at. % (see Comparative Examples 3-3 to 3-6). However, the friction coefficient dramatically decreased when the average fluorine concentration in resin was 23 at. % (see Example 3-8), and it was observed that friction was reduced when the average fluorine concentration in resin was equal to or higher than 22 at. % (see Examples 3-6 to 3-8). These results demonstrated that friction on the sliding surface was reduced when the average fluorine concentration in resin was equal to or higher than the nitrogen concentration of the amorphous carbon nitride coating.

Example 4

Relationship Between Fluorine Concentration on Resin Surface and Friction Coefficient Plate specimens formed of polypropylene each having a fluorinated surface were prepared, and a frictional wear resistance test similar to the one described above was conducted to investigate the relationship between the resin surface fluorine concentration and the friction coefficient. The fluorination was conducted as follows: plate specimens formed of polypropylene were placed in a chamber filled with hydrogen fluoride and heat-treated at 120° C. for varying duration of time to prepare plate specimens each having a different resin surface fluorine concentration. The analysis of each surface fluorine concentration was conducted by X-ray photoelectron spectroscopy (analysis depth: about 10 nm). As the ring specimens, Sample 3 (N concentration=10 at. %) and Sample 11 (N concentration=0 at. %) were used. The results are shown in Table 4.

TABLE 4

Relationship between Fluorine Concentration on Resin Surface and Friction Coefficient.

| Sample No. | | Nitrogen Concentration in Coating | Resin Surface Fluorine Concentration | Friction Coefficient |
|---|---|---|---|---|
| Example 4-1 | Sample 3 | 10 at. % | 23 at. % | 0.12 |
| Example 4-2 | | | 14 at. % | 0.13 |
| Example 4-3 | | | 10 at. % | 0.14 |
| Comparative Example 4-1 | | | 6 at. % | 0.30 |
| Comparative Example 4-2 | | | 0 at. % | 0.32 |
| Comparative Example 4-3 | Sample 11 | 0 at. % | 23 at. % | 0.20 |
| Comparative Example 4-4 | | | 14 at. % | 0.24 |
| Comparative Example 4-5 | | | 10 at. % | 0.25 |
| Comparative Example 4-6 | | | 6 at. % | 0.25 |
| Comparative Example 4-7 | | | 0 at. % | 0.28 |

As shown in Table 4, the amorphous carbon nitride of Sample 3 (N concentration=10 at. %) exhibited a high friction coefficient when the resin surface fluorine concentration was lower than 10 at. % (see Comparative Examples 4-1 and 4-2). However, the friction coefficient dramatically decreased when the resin surface fluorine concentration was 10 at. % (see Example 4-3), and it was observed that friction was reduced when the resin surface fluorine concentration was equal to or higher than 10 at. % (see Examples 3-1 to 3-3). On the contrary, the friction coefficient of the amorphous carbon nitride of Sample 11 (N concentration=0 at. %) was high in every specimen although it tended to decrease with increasing the resin surface fluorine concentration. These results demonstrated that friction on the sliding surface was reduced when the resin surface fluorine concentration was equal to or higher than the nitrogen concentration of the amorphous carbon nitride coating. Also, it was observed that a non-fluorine-containing resin molded body having a fluorinated surface may be used as a plate specimen (i.e. seal member).

Example 5

Relationship Between Fluorine Doping Through Filler and Friction Coefficient

Plate specimens formed of a mixture of polyethylene and a powder filler (average particle size: 50 μm) of calcium fluoride ($CaF_2$) were prepared, and a frictional wear test similar to the one described above was conducted to investigate the relationship between fluorine doping through a filler and the friction coefficient using the frictional wear testing device used in Example 1. An observation and compositional analysis of the area ratio of calcium fluoride on the surface of each plate specimen were conducted by scanning electron microscope-energy dispersive X-ray spectroscopy (SEM-EDX), and a detailed compositional analysis of the fluorine concentration was conducted by the X-ray photoelectron spectroscopy. As the ring specimens, Sample 3 (N concentration=10 at. %) was used. The results are shown in Table 5. Table 5 is a list of friction coefficients of Examples and Comparative Examples each having a different area ratio of calcium fluoride.

TABLE 5

Relationship between Fluorine Doping through Filler and Friction Coefficient.

| Sample No. | | Nitrogen Concentration in Coating | Area Ratio of $CaF_2$ at Resin Surface | Resin Surface Fluorine Concentration | Friction Coefficient |
|---|---|---|---|---|---|
| Example 5-1 | Sample 3 | 10 at. % | 45% | 30 at. % | 0.07 |
| Example 5-2 | | | 32% | 21 at. % | 0.09 |
| Example 5-3 | | | 25% | 17 at. % | 0.10 |
| Example 5-4 | | | 17% | 11 at. % | 0.14 |
| Comparative Example 5-1 | | | 10% | 7 at. % | 0.32 |
| Comparative Example 5-2 | | | 0% | 0 at. % | 0.35 |

As shown in Table 5, the amorphous carbon nitride of Sample 3 (N concentration=10 at. %) exhibited a high friction coefficient when the resin surface fluorine concentration was lower than 10 at. % (see Comparative Examples 5-1 and 5-2). However, the friction coefficient dramatically decreased when the resin surface fluorine concentration was 11 at. % (see Example 5-4), and it was observed that friction was reduced when the resin surface fluorine concentration was equal to or higher than 10 at. % (see Examples 5-1 to 5-4). These results demonstrated that friction on the sliding surface was reduced when the resin surface fluorine concentration was equal to or higher than the nitrogen concentration of the amorphous carbon nitride coating. Also, it was observed that a non-fluorine-containing resin doped with fluorine through a filler may be used as a plate specimen (i.e. seal member).

Example 6

Plunger Pump

Figure 4:
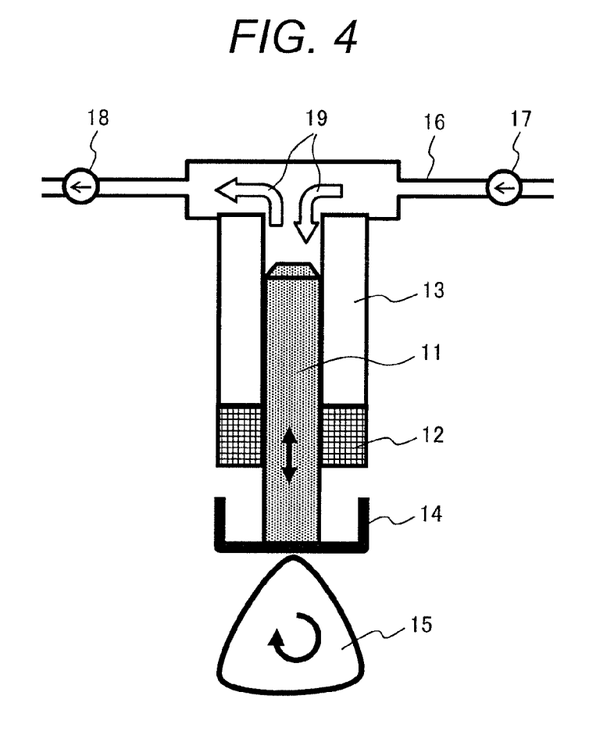
FIG. 4 is a schematic diagram showing a cross-sectional view of an example of a plunger pump and the peripheral structure thereof.

FIG. 4 is a schematic diagram showing a cross-sectional view of an example of a plunger pump and the peripheral structure thereof. As shown in FIG. 4, a plunger pump is a pump having a mechanism by which the rotary motion of a cam 15 causes a plunger 11 to reciprocate and repeatedly enter and leave a fluid flow path 16, thereby allowing a fluid 19 such as water, oil, and fuel to flow in through a suction valve 17 and flow out through a delivery valve 18. The bottom face of the plunger 11 (or a lifter 14) slides against the cam 15, and the side face of the plunger 11 slides against a cylinder 13 and a seal 12. The cylinder 13 is important in securing the path through which the plunger 11 moves, and the seal 12 is important in preventing leakage of the fluid 19 and entry of foreign matters (e.g., a lubricant for a cam drive) into the fluid 19. In a high-pressure plunger pump, in particular, the fluid 19 is supplied at a high pressure, therefore it is necessary to increase the seal surface pressure. As a result, high friction occurs on the sliding contact surface between the plunger 11 and the seal 12.

A frictional wear endurance test (2000 hours) of the plunger 11 was conducted using an accelerated testing device designed such that the sliding contact surface pressure between the plunger 11 and the seal 12 becomes about twice that of actual equipment. In the case where the side face of the plunger was coated with a common amorphous carbon coating (corresponding to Sample 11), and PTFE (containing 10 volume percent of a carbon fiber filler) was used as the seal 12, the amorphous carbon coating wore more significantly on its sliding contact surface with the seal 12 than on its sliding contact surface with the cylinder 13. In contrast, in the case where the side face of the plunger 11 was coated with an amorphous carbon nitride coating or an amorphous carbon nitride boride coating in accordance with the present invention, and PTFE (containing 10 volume percent of a carbon fiber filler) was used as the seal 12 as with the above, it was observed that the amount of wear of the amorphous carbon coating was reduced to equal to or less than 1/10 of that of a conventional amorphous carbon coating, indicating that the amorphous carbon coating in accordance with the invention had excellent wear resistance (durability).

The description above has been based on the case of a slide part comprising a combination of a hard member coated with an amorphous carbon coating containing nitrogen on the outermost surface of the substrate thereof and a seal member containing fluorine on its sliding contact surface with the hard member. It should be noted, however, that the present invention is not limited to this, and other combinations may be employed as long as the mechanism of reducing friction is attributable to the repulsive force between ions on the sliding surface. For example, it can be expected that a slide part comprising a combination of a hard member coated with an amorphous carbon coating containing fluorine on the outermost surface of the substrate thereof and a seal member containing nitrogen on its sliding contact surface with the hard member will have the same advantages.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A slide part, comprising:
a hard member having an amorphous carbon coating containing nitrogen formed on an outermost surface of a substrate; and
a seal member formed of an elastic body, the seal member being in sliding contact with the hard member to prevent fluid leakage past a sliding contact surface region of the seal member, wherein:
content of the nitrogen in the amorphous carbon coating is equal to or more than 3 atomic percentage (at. %) and equal to or less than 25 at. %, taking a total content of the carbon and the nitrogen in the amorphous carbon coating as 100 at. %;
the seal member contains fluorine at least in the sliding contact surface region thereof; and
content of the fluorine in the sliding contact surface region of the seal member is equal to or more than the nitrogen content in the amorphous carbon coating, and wherein:
a plurality of interlayers are provided between the amorphous carbon coating and the substrate of the hard member, the plurality of interlayers comprising:
a first interlayer formed of chromium immediately on the substrate; and
a second interlayer formed of said chromium and the elements composting the amorphous carbon coating immediately on the first interlayer such that content of said chromium gradually decreases as content of the elements composting the amorphous carbon coating gradually increases in the second interlayer.

2. The slide part according to claim 1, wherein the nitrogen content in the amorphous carbon coating is equal to or more than 6 at. % and equal to or less than 22 at. %.

3. A slide part, comprising:
a hard member having an amorphous carbon coating containing nitrogen and boron formed on an outermost surface of a substrate; and
a seal member formed of an elastic body, the seal member being in sliding contact with the hard member to prevent fluid leakage past a sliding contact surface region of the seal member, wherein:
content of the nitrogen in the amorphous carbon coating is equal to or more than 3 atomic percentage (at. %) and equal to or less than 45 at. %, assuming a total content of the carbon, the nitrogen and the boron in the amorphous carbon coating as 100 at. %;
a ratio between the nitrogen content [N] and the boron content [B] satisfies "$0.95 \leq [B]/[N] \leq 1.05$";
the seal member contains fluorine at least in the sliding contact surface region thereof; and
content of the fluorine in the sliding contact surface region of the seal member is equal to or more than the nitrogen content in the amorphous carbon coating, and wherein
a plurality of interlayers are provided between the amorphous carbon coating and the substrate of the hard member, the plurality of interlayers comprising:
a first interlayer formed of chromium immediately on the substrate; and
a second interlayer formed of said chromium and the elements composing the amorphous carbon coating immediately on the first interlayer such that content of said chromium gradually decreases as content of the elements composing the amorphous carbon coating gradually increases in the second interlayer.

4. The slide part according to claim 3, wherein the nitrogen content in the amorphous carbon coating is equal to or more than 12 at. % and equal to or less than 45 at. %.

5. Equipment including the slide part according to claim 1, wherein the seal member seals a fluid comprising a gas phase and/or a liquid phase.

6. Equipment including the slide part according to claim 3, wherein the seal member seals a fluid comprising a gas phase and/or a liquid phase.

7. A plunger pump including the slide part according to claim 1, wherein:
the hard member is a plunger; and
the seal member is a ring seal in sliding contact with the plunger.

8. A plunger pump including the slide part according to claim 3, wherein:
the hard member is a plunger; and
the seal member is a ring seal in sliding contact with the plunger.

9. A method for manufacturing the hard member according to claim 1, the method comprising the step of forming the amorphous carbon coating on the outermost surface of the substrate by reactive sputtering using an unbalanced magnetron sputtering device, wherein:
a graphite target is used as a carbon component supply source; and
a nitrogen gas and/or an ammonia gas is used as a nitrogen component supply source.

10. A method for manufacturing the hard member according to claim 3, the method comprising the step of forming the amorphous carbon coating on the outermost surface of the substrate by reactive sputtering using an unbalanced magnetron sputtering device, wherein:
a graphite target is used as a carbon component supply source;

a boron carbide target or a boron nitride target is used as a boron component supply source; and a nitrogen gas and/or an ammonia gas is used as a nitrogen component supply source.

* * * * *